US011661654B2

(12) United States Patent
Chandrasekharan et al.

(10) Patent No.: US 11,661,654 B2
(45) Date of Patent: May 30, 2023

(54) SUBSTRATE PROCESSING SYSTEMS INCLUDING GAS DELIVERY SYSTEM WITH REDUCED DEAD LEGS

(71) Applicant: LAM RESEARCH CORPORATION, Fremont, CA (US)

(72) Inventors: Ramesh Chandrasekharan, Portland, OR (US); Antonio Xavier, Mulino, OR (US); Frank Loren Pasquale, Tigard, OR (US); Ryan Blaquiere, Portland, OR (US); Jennifer Leigh Petraglia, Portland, OR (US); Meenakshi Mamunuru, Tigard, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 906 days.

(21) Appl. No.: 15/956,296

(22) Filed: Apr. 18, 2018

(65) Prior Publication Data
US 2019/0323125 A1    Oct. 24, 2019

(51) Int. Cl.
| C23C 16/40 | (2006.01) |
| C23C 16/455 | (2006.01) |
| H01L 21/67 | (2006.01) |
| H01J 37/32 | (2006.01) |
| C23C 16/44 | (2006.01) |

(52) U.S. Cl.
CPC .... *C23C 16/45565* (2013.01); *C23C 16/4404* (2013.01); *C23C 16/45561* (2013.01); *H01J 37/3244* (2013.01); *H01L 21/67017* (2013.01)

(58) Field of Classification Search
CPC ........ C23C 16/45565; C23C 16/45561; C23C 16/4404; C23C 16/45544; C23C 16/5096; H01L 21/67017; H01J 37/3244; G05D 7/00

USPC .......... 118/715; 156/345.29, 345.33, 345.34
See application file for complete search history.

(56) References Cited

U.S. PATENT DOCUMENTS

| 2,584,436 A | 2/1952 | Donaldson |
| 2,758,877 A | 8/1956 | Gleason |
| 4,232,063 A | 11/1980 | Rosler et al. |

(Continued)

FOREIGN PATENT DOCUMENTS

| CN | 1231735 A | 10/1999 |
| CN | 104040689 A | 9/2014 |

OTHER PUBLICATIONS

First Office Action corresponding to Chinese Patent Application No. 201610549750.3 dated Aug. 28, 2018, 8 pages.

(Continued)

*Primary Examiner* — Rudy Zervigon

(57) ABSTRACT

A gas delivery system includes a 2-port valve including a first valve located between a first port and a second port. A 4-port valve includes a first node connected to a first port and a second port. A bypass path is located between the third port and the fourth port. A second node is located along the bypass path. A second valve is located between the first node and the second node. A manifold block defines gas flow channels configured to connect the first port of the 4-port valve to a first inlet, configured to connect the second port of the 4-port valve to the first port of the 2-port valve, the third port of the 4-port valve to a second inlet, the second port of the 2-port valve to a first outlet, and the fourth port of the 4-port valve to a second outlet.

10 Claims, 10 Drawing Sheets

(56) References Cited

U.S. PATENT DOCUMENTS

| | | |
|---|---|---|
| 4,243,070 A | 1/1981 | Jackson |
| 4,315,479 A | 2/1982 | Toole et al. |
| 4,660,598 A | 4/1987 | Butterfield et al. |
| 4,751,192 A | 6/1988 | Hirooka et al. |
| 4,761,269 A | 8/1988 | Conger et al. |
| 4,793,283 A | 12/1988 | Sarkozy |
| 4,798,166 A | 1/1989 | Hirooka et al. |
| 4,822,636 A | 4/1989 | Saitoh et al. |
| 5,273,609 A | 12/1993 | Moslehi |
| 5,328,558 A | 7/1994 | Kawamura |
| 5,391,232 A | 2/1995 | Kanai et al. |
| 5,620,559 A | 4/1997 | Kikuchi |
| 5,900,214 A | 5/1999 | Girard et al. |
| 5,939,831 A | 8/1999 | Fong et al. |
| 5,956,859 A | 9/1999 | Matsumoto et al. |
| 6,102,071 A | 8/2000 | Walton et al. |
| 6,167,323 A | 12/2000 | Komino |
| 6,190,460 B1 | 2/2001 | Hwang |
| 6,329,297 B1 | 12/2001 | Balish et al. |
| 6,511,539 B1 | 1/2003 | Raaijmakers |
| 6,981,517 B2 * | 1/2006 | Snijders ............... B01J 4/02 137/597 |
| 7,017,514 B1 | 3/2006 | Shepherd, Jr. et al. |
| 7,204,886 B2 | 4/2007 | Chen et al. |
| 7,389,792 B2 | 6/2008 | Newberg |
| 7,402,210 B2 | 7/2008 | Chen et al. |
| 7,452,423 B2 | 11/2008 | Kim et al. |
| 7,591,907 B2 | 9/2009 | Chen et al. |
| 7,780,785 B2 | 8/2010 | Chen et al. |
| 8,070,879 B2 | 12/2011 | Chen et al. |
| 8,210,203 B2 | 7/2012 | DeVries et al. |
| 8,291,857 B2 | 10/2012 | Lam et al. |
| 8,304,021 B2 | 11/2012 | Yamamoto et al. |
| 8,460,468 B2 | 6/2013 | Piechulla et al. |
| 8,721,790 B2 | 5/2014 | Kato et al. |
| 8,985,152 B2 | 3/2015 | Chandrasekharan et al. |
| 9,053,909 B2 | 6/2015 | Kato et al. |
| 9,127,358 B2 | 9/2015 | Inoue et al. |
| 9,163,311 B2 | 10/2015 | Hasegawa et al. |
| 9,449,859 B2 | 9/2016 | Song |
| 9,631,276 B2 | 4/2017 | Chandrasekharan et al. |
| 9,920,844 B2 | 3/2018 | Leeser |
| 2002/0020429 A1 | 2/2002 | Selbrede et al. |
| 2004/0250853 A1 | 12/2004 | Snijders |
| 2004/0266175 A1 | 12/2004 | Chen et al. |
| 2005/0092245 A1 | 5/2005 | Moon et al. |
| 2006/0060253 A1 | 3/2006 | Yoshida et al. |
| 2007/0066038 A1 * | 3/2007 | Sadjadi ............ H01J 37/32091 438/478 |
| 2007/0281106 A1 | 12/2007 | Lubomirsky et al. |
| 2008/0241381 A1 | 10/2008 | Suzuki |
| 2008/0292430 A1 | 11/2008 | Piechulla et al. |
| 2009/0241834 A1 | 10/2009 | Kato |
| 2009/0250126 A1 | 10/2009 | Koyomogi |
| 2010/0055347 A1 | 3/2010 | Kato et al. |
| 2011/0008955 A1 | 1/2011 | Horii et al. |
| 2012/0064698 A1 | 3/2012 | Olgado |
| 2012/0160169 A1 | 6/2012 | Hasegawa et al. |
| 2012/0180719 A1 | 7/2012 | Inoue et al. |
| 2012/0180727 A1 | 7/2012 | Hasegawa et al. |
| 2013/0146095 A1 | 6/2013 | Avoyan et al. |
| 2013/0312663 A1 | 11/2013 | Khosla et al. |
| 2013/0333768 A1 | 12/2013 | Chandrasekharan et al. |
| 2014/0182515 A1 | 7/2014 | Yamazaki et al. |
| 2014/0339330 A1 | 11/2014 | Hong et al. |
| 2015/0086722 A1 | 3/2015 | Gandikota et al. |
| 2016/0032453 A1 | 2/2016 | Qian et al. |
| 2016/0147234 A1 | 5/2016 | Leeser |
| 2016/0281234 A1 | 9/2016 | Won et al. |
| 2017/0016115 A1 | 1/2017 | Chandrasekharan et al. |
| 2017/0175269 A1 | 6/2017 | Chandrasekharan et al. |

OTHER PUBLICATIONS

First Office Action dated Oct. 10, 2017 corresponding to Chinese Patent Application No. 201510844234.9, 10 pages.
International Search Report and Written Opinion for Application PCT/US2019/027591 dated Jul. 29, 2019.

* cited by examiner

SUBSTRATE PROCESSING SYSTEMS INCLUDING GAS DELIVERY SYSTEM WITH REDUCED DEAD LEGS

FIELD

The present disclosure relates to substrate processing systems, and more particularly to gas delivery systems for substrate processing systems including reduced dead legs.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching typically include a processing chamber with a pedestal. A substrate such as a semiconductor wafer may be arranged on the pedestal during processing. A process gas mixture including one or more precursors may be introduced into the processing chamber to deposit film on the substrate or to etch the substrate. In some substrate processing systems, radio frequency (RF) plasma can be struck in the processing chamber and/or an RF bias on the pedestal may be used to activate chemical reactions.

Various gas flow paths in the gas delivery system are used to deliver process gases, carrier gases, oxidizing gases, precursor gases and/or purge gases to the processing chamber. The gas flow paths are defined by via tubing, valves, manifolds and gas flow channels in a valve inlet block. Gas may be delivered by a gas flow channel during one portion of the process and gas may not be delivered during other portions of the process. In other words, gas such as a vaporized precursor gas may remain in the gas flow channel temporarily unless a purge process is performed to clear the gas flow channel. Portions of gas flow channels that hold stagnant gases are called dead legs. Stagnant gas in the dead legs may decompose and cause defects on the substrate.

SUMMARY

A gas delivery system for a substrate processing system includes a 2-port valve including a first port and a second port and a first valve located between the first port and the second port. A 4-port valve includes a first port, a second port, a third port and a fourth port. A first node is connected to the first port and the second port. A bypass path is located between the third port and the fourth port. A second node is located along the bypass path between the third port and the fourth port. A second valve is located between the first node and the second node. A manifold block defines gas flow channels configured to connect the first port of the 4-port valve to a first inlet, configured to connect the second port of the 4-port valve to the first port of the 2-port valve, configured to connect the third port of the 4-port valve to a second inlet, configured to connect the second port of the 2-port valve to a first outlet, and configured to connect the fourth port of the 4-port valve to a second outlet.

In other features, gas delivery system includes a first gas source, a second gas source; a manifold connected to the first inlet. A third valve selectively connects the first gas source to the manifold. A fourth valve selectively connects the second gas source to the manifold.

In other features, the first gas source supplies a push gas, the second gas source supplies a dose gas, and the second outlet is connected to a processing chamber. The dose gas source includes an ampoule supplying vaporized precursor.

In other features, the gas delivery system further includes a controller configured to set states of the first valve, the second valve, the third valve and the fourth valve in a diverting mode. During the diverting mode, the first valve is open, the second valve is closed, the third valve is open and the fourth valve is closed.

In other features, the controller is further configured to set the states of the first valve, the second valve, the third valve and the fourth valve in a dosing mode after the diverting mode. During the dosing mode, the first valve is closed, the second valve is open, the third valve is open and the fourth valve is open.

In other features, a dead leg is created between the first node and an inlet of the first valve during the dosing period. The dead leg defines a volume less than 2.5 ml. There is no deadleg volume during the diverting mode.

A substrate processing system includes a processing chamber including a gas distribution device connected to the first outlet of the manifold of the gas delivery system, a substrate support, and an RF generator. A controller is configured to strike plasma between the gas distribution device and the substrate support during a dosing mode.

A gas delivery system for a substrate processing system includes a first 3-port valve including a first port, a second port, a third port, a bypass path and a first node. A first valve is located between the second port and the first node. The bypass path and the first node are located between the first port and the third port. The gas delivery system includes a second 3-port valve including a first port, a second port, a third port, a second node, and a bypass path. A second valve is located between the first port and the second node. The bypass path and the second node are located between the second port and the third port. A manifold block defines gas flow channels configured to connect the first port of the first 3-port valve to a first inlet, configured to connect the second port of the first 3-port valve to a first outlet, configured to connect the second port of the second 3-port valve to a second inlet, configured to connect the third port of the first 3-port valve to the first port of the second 3-port valve, and configured to connect the third port of the second 3-port valve to a second outlet.

In other features, the gas delivery system further includes a first gas source, a second gas source, a manifold connected to the first port of the first 3-port valve, a third valve selectively connecting the first gas source to the manifold, and a fourth valve selectively connecting the second gas source to the manifold.

In other features, the first gas source supplies a push gas, the second gas source supplies a dose gas, and the second outlet is connected to a processing chamber.

In other features, a controller is configured to control the first valve, the second valve, the third valve and the fourth valve into a diverting mode. During the diverting mode, the first valve is open, the second valve is closed, the third valve is open and the fourth valve is closed.

In other features, the controller is further configured to control the first valve, the second valve, the third valve and the fourth valve in a dosing mode after the diverting mode. During the dosing mode, the first valve is closed, the second valve is open, the third valve is open and the fourth valve is open.

In other features, a dead leg is created between the first node and an inlet of the second valve. The dead leg occurs during the diverting mode. The dose gas source includes an ampoule supplying vaporized precursor. The dead leg defines a volume less than 2.5 ml.

A substrate processing system includes a processing chamber including a gas distribution device connected to the first outlet of the gas delivery system, a substrate support, and an RF generator. A controller is configured to strike plasma between the gas distribution device and the substrate support during dosing.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Several valve assembly arrangements according to the present disclosure significantly reduce defects during substrate processing by reducing dead leg volume when delivering process gas mixtures such as precursor gas and/or vaporized precursor. In a first valve assembly, a combination of two 3-port valves is used to reduce dead leg volume. In a second valve assembly, a combination of a 4-port valve and a 2-port valve are used to reduce dead leg volume.

Figure 1:
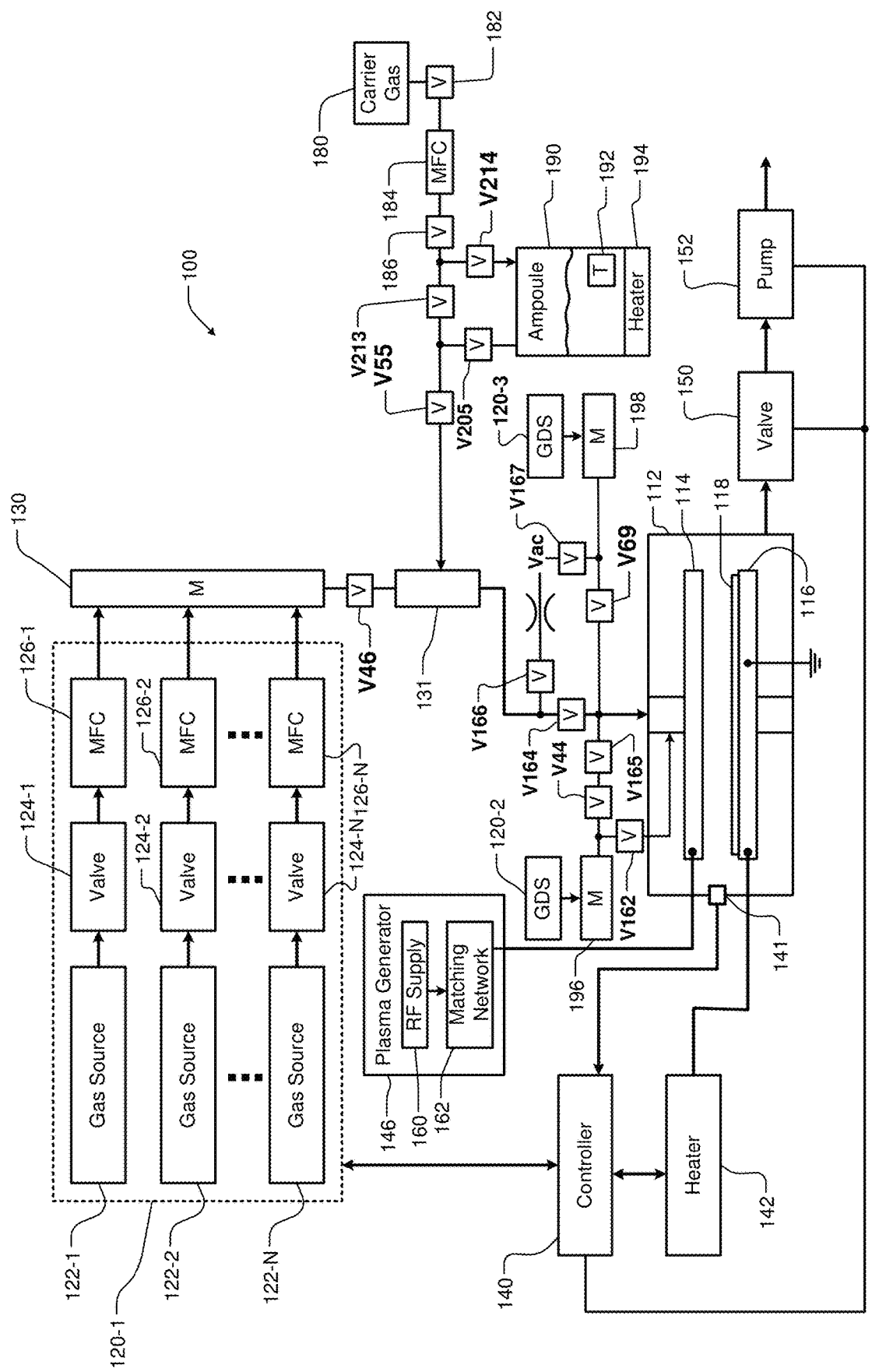
FIG. 1 is a functional block diagram of an example of a substrate processing system according to the present disclosure.

Referring now to FIG. 1, an example of a substrate processing system 100 includes a processing chamber 112 with a reaction volume. In some examples, a plasma-enhanced chemical vapor deposition (CVD) or plasma enhanced atomic layer deposition (ALD) process may be performed, although other etching, deposition or other substrate processes may be performed.

Process gas mixtures may be supplied to the processing chamber 112 using a gas distribution device 114 such as a showerhead. In some examples, the showerhead is a chandelier-type showerhead. A substrate 118 such as a semiconductor wafer may be arranged on a substrate support 116 during processing. The substrate support 116 may include a pedestal, an electrostatic chuck, a mechanical chuck or other type of substrate support.

One or more gas delivery systems 120-1, 120-2 120-3, . . . may include one or more gas sources 122-1, 122-2, . . . , and 122-N(collectively gas sources 122), where N is an integer greater than one. Valves 124-1, 124-2, . . . , and 124-N (collectively valves 124), mass flow controllers 126-1, 126-2, . . . , and 126-N(collectively mass flow controllers 126), or other flow control devices may be used to controllably supply one or more gases to a manifold 130, which supplies a gas mixture via a valve V46, a manifold 131, and a valve V164 to the processing chamber 112. In some examples, the manifold 131 is a heated injector manifold. One or more additional gas delivery systems may be provided to supply gases or gas mixtures in other locations. A divert path including a valve V166 selectively diverts gas to vacuum or exhaust.

A controller 140 may be used to monitor process parameters such as temperature, pressure, etc. (using one or more sensors 141) and to control process timing. The controller 140 may be used to control process devices such as gas delivery systems 120-1, 120-2 and 120-3, a substrate support heater 142, and/or an RF plasma generator 146. The controller 140 may also be used to evacuate the processing chamber 112 using a valve 150 and pump 152.

The RF plasma generator 146 generates the RF plasma in the processing chamber. The RF plasma generator 146 may be an inductive or capacitive-type RF plasma generator. In some examples, the RF plasma generator 146 may include an RF supply 160 and a matching and distribution network 162. While the RF plasma generator 146 is shown connected to the gas distribution device 114 and the substrate support is grounded or floating, the RF plasma generator 146 can be connected to the substrate support 116 and the gas distribution device 114 can be grounded or floating.

Vaporized precursor can be supplied to the manifold 131 by an ampoule 190 that supplies vaporized liquid precursor. A carrier gas 180 is supplied via valve 182, MFC 184, and valve 186. Additional valves V213, V205, V214 and V55 control delivery of the carrier gas and/or delivery of the carrier gas and vaporized precursor from the ampoule 190. In some examples, the ampoule 190 is heated by a heater 194. The ampoule 190 may further include one or more temperature sensors 192 to detect a temperature of the precursor liquid in the ampoule 190. The controller 140 may be used to sense the temperature of the precursor liquid and to control the heater 194 to heat the precursor liquid to a predetermined temperature.

As can be appreciated, when valve V213 is closed and valves V205 and V214 are open, carrier gas flows through the ampoule 190 and entrains vaporized precursor. The mixture of carrier gas and vaporized precursor is delivered by valve V55 to the manifold 131 and by the valve V164 to the gas distribution device 114. In some examples, a gas delivery system 120-2 delivers a gas mixture to a manifold 196 and valves V44 and V165 control delivery of the gases to the processing chamber. In some examples, a valve V162 provides a secondary purge gas mixture to the stem of the showerhead. In some examples, a gas delivery system 120-3 delivers gases to a manifold 198 and valves V69 and V167 control delivery of the gases to vacuum, exhaust or the processing chamber.

Figure 2:
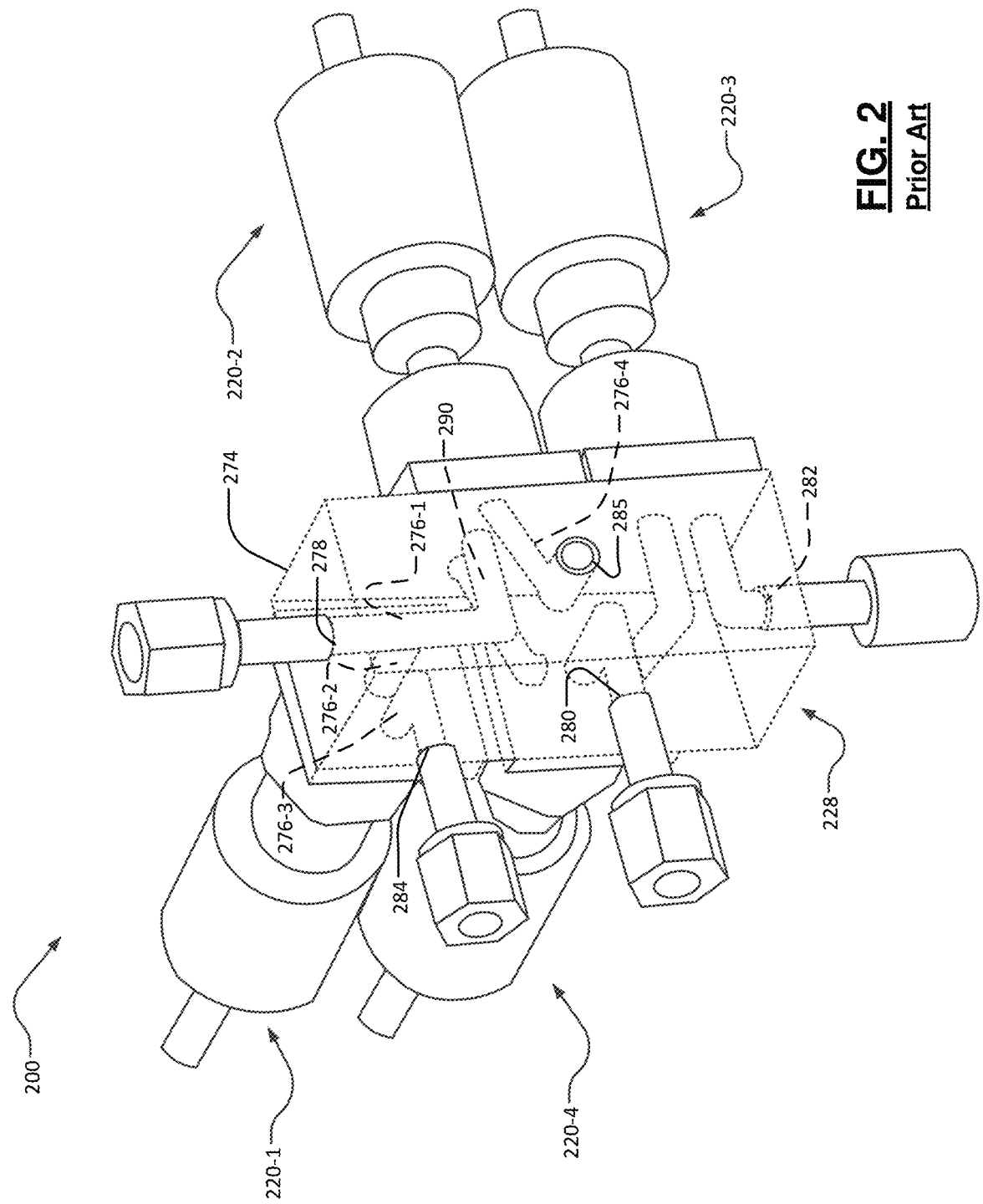
FIG. 2 is a perspective view of an example of a gas delivery assembly according to the prior art.

Referring now to FIG. 2, a gas delivery assembly 200 is shown to include one or more valve assemblies 220-1, 220-2 . . . and 220-4 (collectively valve assemblies 220) and a valve manifold 228. The valve assemblies 220 are configured to control the flow of fluid(s) into and out of the valve manifold 228. In this regard, the valve manifold 228 includes a body 274 defining one or more gas channels 276-1, 276-2 . . . and 276-N (collectively gas channels 276), first, second and third inlets 278, 280, 282, and first and second outlets 284, 285.

The first gas channel 276-1 extends from, and fluidly communicates with, the first inlet 278 of the valve manifold 228 and the second valve assembly 220-2. The second gas channel 276-2 extends from the first gas channel 276-1 to the first valve assembly 220-1. The third gas channel 276-3 extends from the first valve assembly 220-1 to the first outlet 284 of the valve manifold 228. The fourth gas channel 276-4 extends from the second valve assembly 220-2 to the second outlet 285 of the valve manifold 228.

The gas delivery assembly 200 is operated in at least three modes, such as a divert mode, a supply mode, and a standby mode. The gas delivery assembly 200 may operate in a continuous cycle such that the divert mode precedes the supply mode, the supply mode precedes the standby mode, and the standby mode precedes the divert mode. In the divert mode, stale precursor in the gas channels 276 may be replaced with fresh precursor. In the supply mode, vaporized precursor is supplied to the processing chamber. In the standby mode, vaporized precursor is not supplied and is not diverted.

When supplying vaporized precursor, the first valve assembly 220-1 is closed and the second valve assembly 220-2 is open. The vaporized precursor gas is supplied through the first gas channel 276-1 from the first inlet 278 to the second valve assembly 220-2. The vaporized precursor gas flows through the second valve assembly 220-2 and the fourth gas channel 276-4 to the processing chamber or other portion of the substrate processing system.

During the standby mode, the first and second valve assemblies 220-1, 220-2 are closed such that flow of vaporized precursor from the first inlet 278 is prevented. Accordingly, during the standby mode, vaporized precursor gas remains in the first gas channel 276-1. In some conditions, the stagnant vaporized precursor in the first gas channel 276-1 may condense into particles. Stagnant vaporized precursor that later enters the processing chamber can cause defects.

Prior to supplying vaporized precursor to the processing chamber in the supply mode, the vaporized precursor is diverted and discarded such that the stale vaporized precursor in the gas channel 276-1 is replaced by fresh precursor. When diverting the vaporized precursor, the first valve assembly 220-1 is open and the second valve assembly 220-2 is closed. When vaporized precursor gas is supplied through the first gas channel 276-1 from the first inlet 278, the vaporized precursor gas flows out of the valve manifold 228 through the second gas channel 276-2, the first valve assembly 220-1 and the third gas channel 276-3.

While the divert mode provides some improvement, not all of the stale vaporized precursor is removed. The gas delivery assembly 200 has a dead-leg volume 290 that is located downstream from the second gas channel 276-2 and upstream from the second valve assembly 220-2. Specifically, the vaporized precursor that stagnates in the dead-leg volume during the standby mode is not diverted through the first valve assembly 220-1 during the divert mode. Vaporized precursor that was trapped in the dead-leg volume 290 during the divert mode still flows into the processing chamber from the first and fourth gas channels 276-1, 276-4 during the supply mode and creates defects in the substrate.

Figure 3:
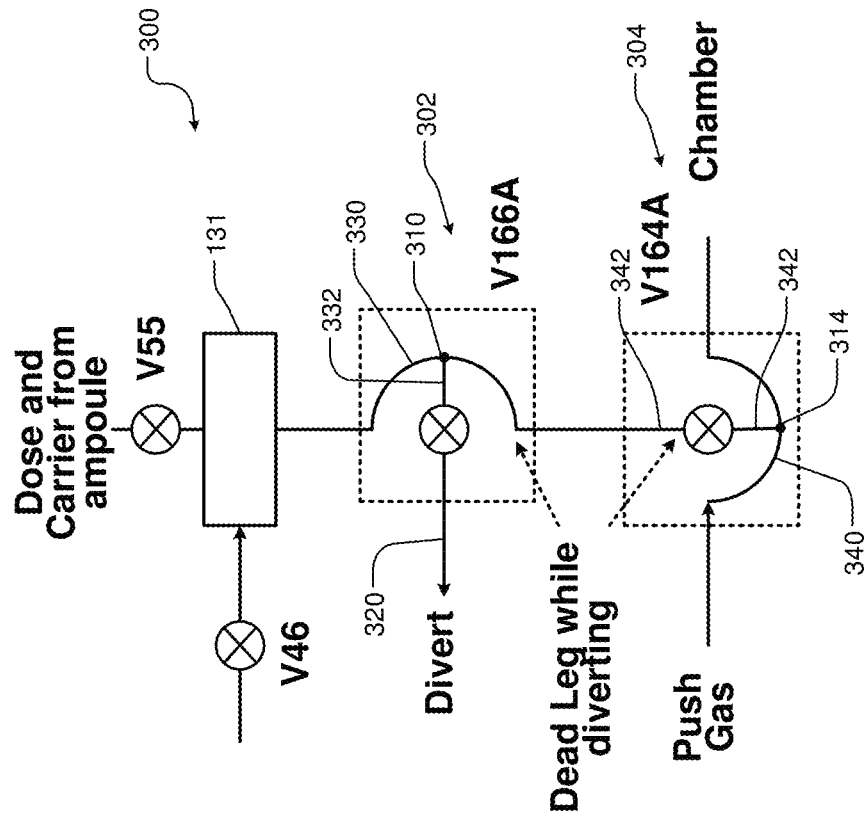
FIG. 3 is a schematic view of an example of a first valve assembly of a gas delivery system including two 3-port valves.

Referring now to FIG. 3, a first valve assembly 300 for a gas delivery system includes a first 3-port valve 302 and a second 3-port valve 304. The first 3-port valve 302 includes a first port receiving gas from an outlet of the manifold 131. The first port is connected to a bypass path 330 and to a first node 310. A second port (or divert path 320) of the first 3-port valve 302 is connected through a first valve V166A to the first node 310 (valved path 332). A third port is connected to the bypass path 330 and to the first node 310.

A first port of the second 3-port valve 304 is connected by a valved path 342 through a second valve V164A to a second node 314. A second port of the second 3-port valve 304 supplies gas such as push gas and is connected to a bypass path 340 and to the second node 314. A third port is connected to the bypass path 340 and to the second node 314. The third port is connected to the processing chamber.

Figure 4:
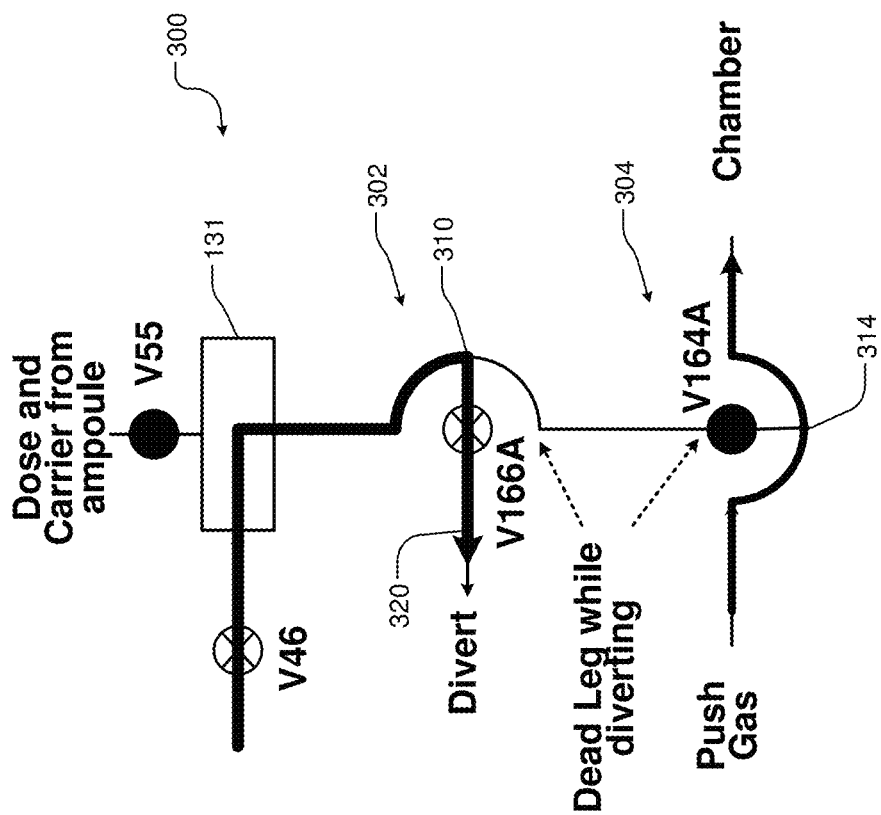
FIG. 4 is a schematic view of an example of the first valve assembly of FIG. 3 during a diverting portion of a recipe.

Referring now to FIG. 4, the first valve assembly 300 is shown in a diverting mode. The valve V46 supplies gas through the manifold 131 (and the valve V55 to the ampoule 190 is closed). The gas delivered to the first port of the first 3-port valve 302 is diverted at the first node 310 through the first valve V166A. The second 3-port valve 304 is closed. A dead leg occurs between the first node 310 and the inlet of the second valve V164A.

Figure 5:
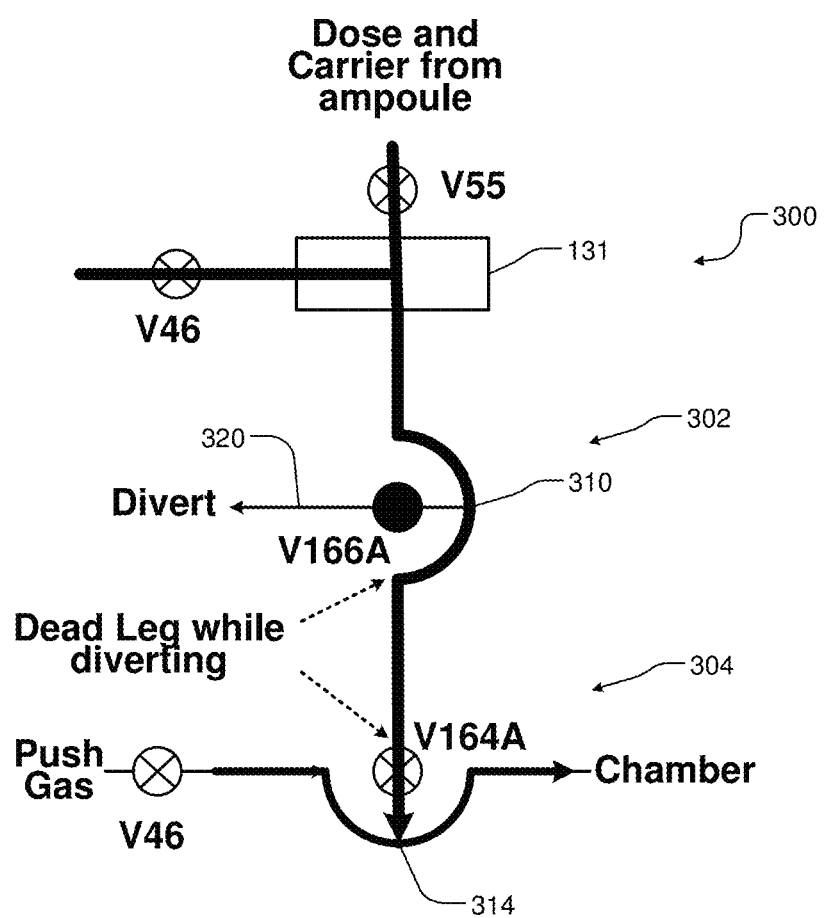
FIG. 5 is a schematic view of an example of the first valve assembly of FIG. 3 during a dosing portion of a recipe.

Referring now to FIG. 5, the first valve assembly 300 is shown during a dosing mode. The valve V46 supplies gas through the manifold 131 (and the valve V55 to the ampoule 190 is open). The vaporized precursor gas mixture from the ampoule 190 is delivered to the first port of the first 3-port valve 302 and is not diverted at the first node 310 by the first valve V166A (which is closed). Rather, the vaporized precursor gas mixture is delivered to the first port of the second 3-port valve 304 (the second valve V164A is open) to the second node 314. The mixture of the push gas and the vaporized precursor is delivered to the processing chamber.

In some examples, the valve assembly 300 defines a very small volume between the first node 310 and the inlet of the second valve V164A. In some examples, the volume is less than 4 ml. In some examples, the volume is less than 3 ml. In other examples, the volume is 2.3 ml. The dose flow to the processing chamber travels through the first and second valves V166A and V164A, respectively. The flow to the processing chamber expands out of the second valve V164A into an inert stream from the manifold 198. During the diverting step, a section between the first and second valves V166A and V164A is not purged. During the dosing step, the section between the first and second valves V166A and V164A is purged to the processing chamber.

Figure 6:
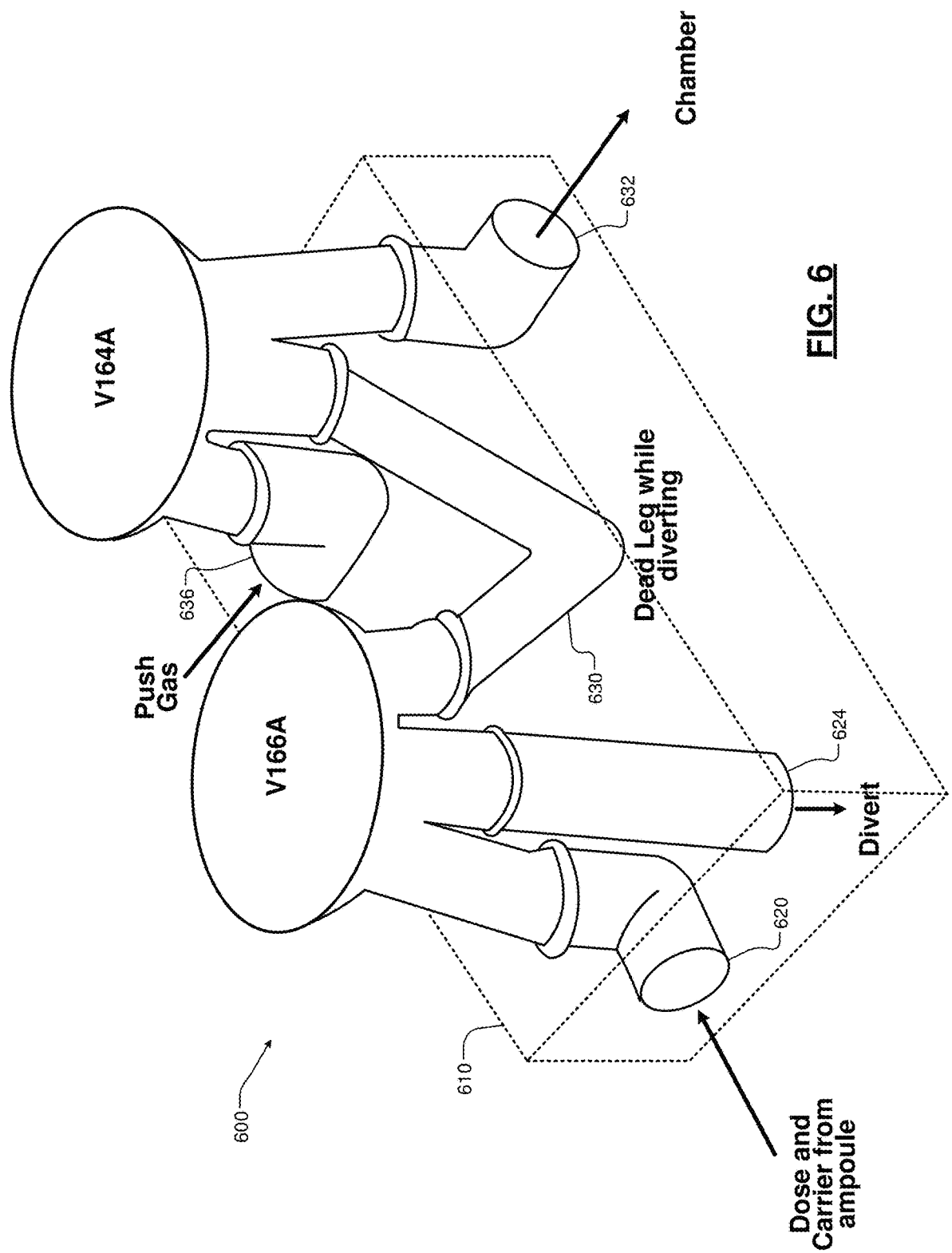
FIG. 6 is a perspective view illustrating an example of a valve manifold and valve inlets of the first valve assembly of FIG. 3.

Referring now to FIG. 6, a portion of the first valve assembly is shown to include a valve manifold block 610 and valve inlets 600 of the first and second 3-port valves 302 and 304, respectively. The valve manifold block 610 defines a first channel 620 connecting the first port of the first 3-port valve 302 and the ampoule 190. The valve manifold block 610 defines a second channel 624 connecting to the second port of the first 3-port valve 302 to the diverting path 320. The valve manifold block 610 defines a third channel 630 connecting the third port of the first 3-port valve 302 to the first port of the second 3-port valve 304. The valve manifold block 610 defines a fourth channel 636 that connects the manifold 198 to the second port of the second 3-port valve 304. The valve manifold block 610 defines a fifth channel 632 connecting the third port of the second 3-port valve 304 to the processing chamber.

Figure 7:
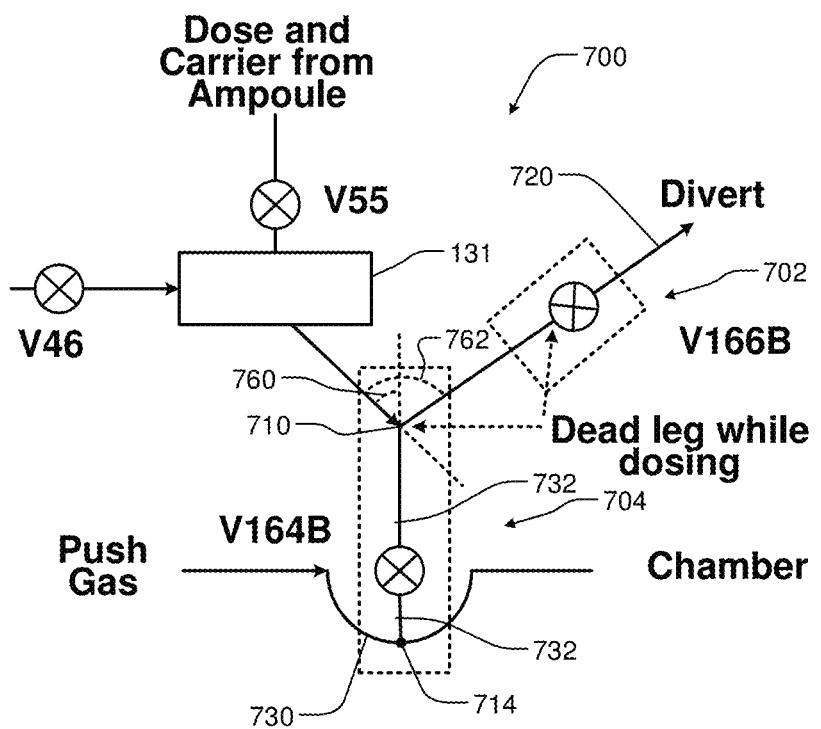
FIG. 7 is a schematic view of an example of a second valve assembly for a gas delivery system including a 4-port valve connected to a 2-port valve.

Referring now to FIG. 7, a second valve assembly 700 includes a 2-port valve 702 and a 4-port valve 704. The 2-port valve 702 includes a first port receiving gas from an outlet of the manifold 131 via a first node 710 of the 4-port valve 704. A second port of the 2-port valve 702 is connected to a divert path 720. A first valve V166B is located between the first and second ports of the 2-port valve 702.

The 4-port valve 704 includes a first port connected to the manifold 131 and to the first node 710. A second port of the 4-port valve 704 connects the first node 710 to the first port of the 2-port valve 702. The first node 710 is connected to the second valve V164B of the 4-port valve 704. A third port of the 4-port valve 704 receives gas such as push gas from the manifold 198 and is connected to the second node 714. A fourth port of the 4-port valve 704 connects the second node 714 to the processing chamber. The 4-port valve 704 includes a bypass path 730 and a valved path 732. The second valve V164B selectively allows flow from the first node 710 to the second node 714 or blocks the flow.

As can be seen in FIG. 7, the first port of the 4-port valve 704 connects to a valved path 732 (at the first node 710) at an angle 760 relative to a path of the valved path 732. The second node of the 4-port valve 704 connects at an angle 762 relative to the first path. In some examples, the angle 760 is an acute angle that is greater than zero. In some examples, the angle 760 is greater than zero and less than 45 degrees. In some examples, the angle 762 is greater than the angle 760. In some examples, the angle 762 is greater than 60 degrees and less than 120 degrees. In some examples, the angle 762 is greater than 70 degrees and less than 100 degrees.

Figure 8:
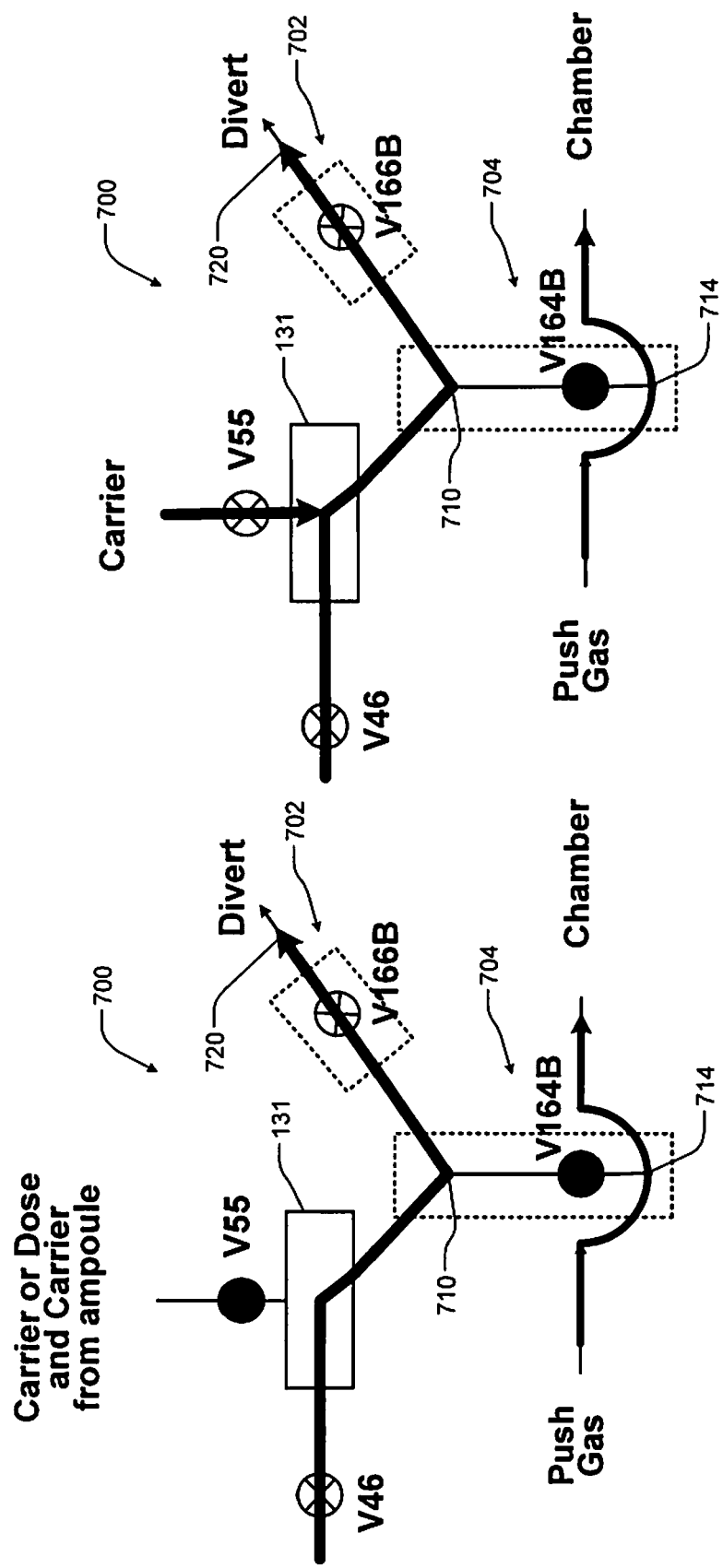
FIGS. 8A and 8B are schematic views of examples of the second valve assembly of FIG. 7 during divert portions of recipes.

Referring now to FIGS. 8A and 8B, the second valve assembly 700 is shown during two example diverting modes. In FIG. 8A, the valve V46 supplies gas through the manifold 131 (and the valve V55 to the ampoule 190 is closed). The gas is delivered to the first port of the 4-port valve 704 (which includes the second valve V164B that is closed). The gas flows through the first node 710 and out the second port of the 4-port valve 704 to the first port of the 2-port valve 702. The first valve V166B of the 2-port valve 702 is open so the gas flows through the 2-port valve 702 to the diverting path 720.

In FIG. 8B, the valve V46 supplies gas from a first gas source through the manifold 131 (and the valves V213 and V55 are open and V205 and V214 are closed). The push and carrier gas are delivered from a second gas source to the first port of the 4-port valve 704 (which includes the second valve V164A that is closed). The gas flows through the first node 710 and out the second port of the 4-port valve 704 to the first port of the 2-port valve 702. The first valve V166B of the 2-port valve 702 is open so the gas flows through the 2-port valve 702 to the diverting path 720.

In both FIGS. 8A and 8B, during the divert mode, the deadleg volume is zero for the second valve assembly 700. In some examples, internal passages of the 4 port valve are cut at an angle in contrast to conventional valves having internal passages that are straight or parallel sections.

Figure 9:
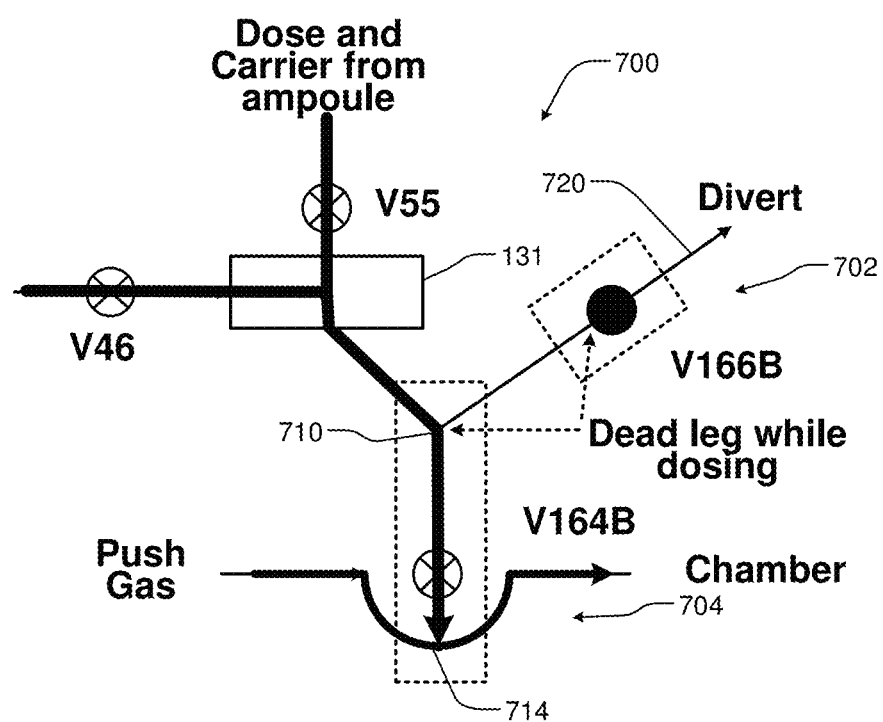
FIG. 9 is a schematic view of an example of the second valve assembly of FIG. 7 during a dosing portion of a recipe.

Referring now to FIG. 9, the second valve assembly 700 is shown during dosing operation. The valve V46 supplies gas through the manifold 131 (and the valve V55 to the ampoule 190 is open). The vaporized precursor gas mixture delivered to the first port of the 4-port valve 704 is not diverted at the first node 710 (since the first valve V166B is closed). Rather, the vaporized precursor gas mixture is delivered to the inlet of the 4-port valve 704 (via the second valve V164B which is open) and then to the second node 714. The mixture of the push gas and the vaporized precursor is delivered to the processing chamber. A dead leg occurs during dosing between the first node 710 and the inlet of the first valve V166B.

Figure 10:
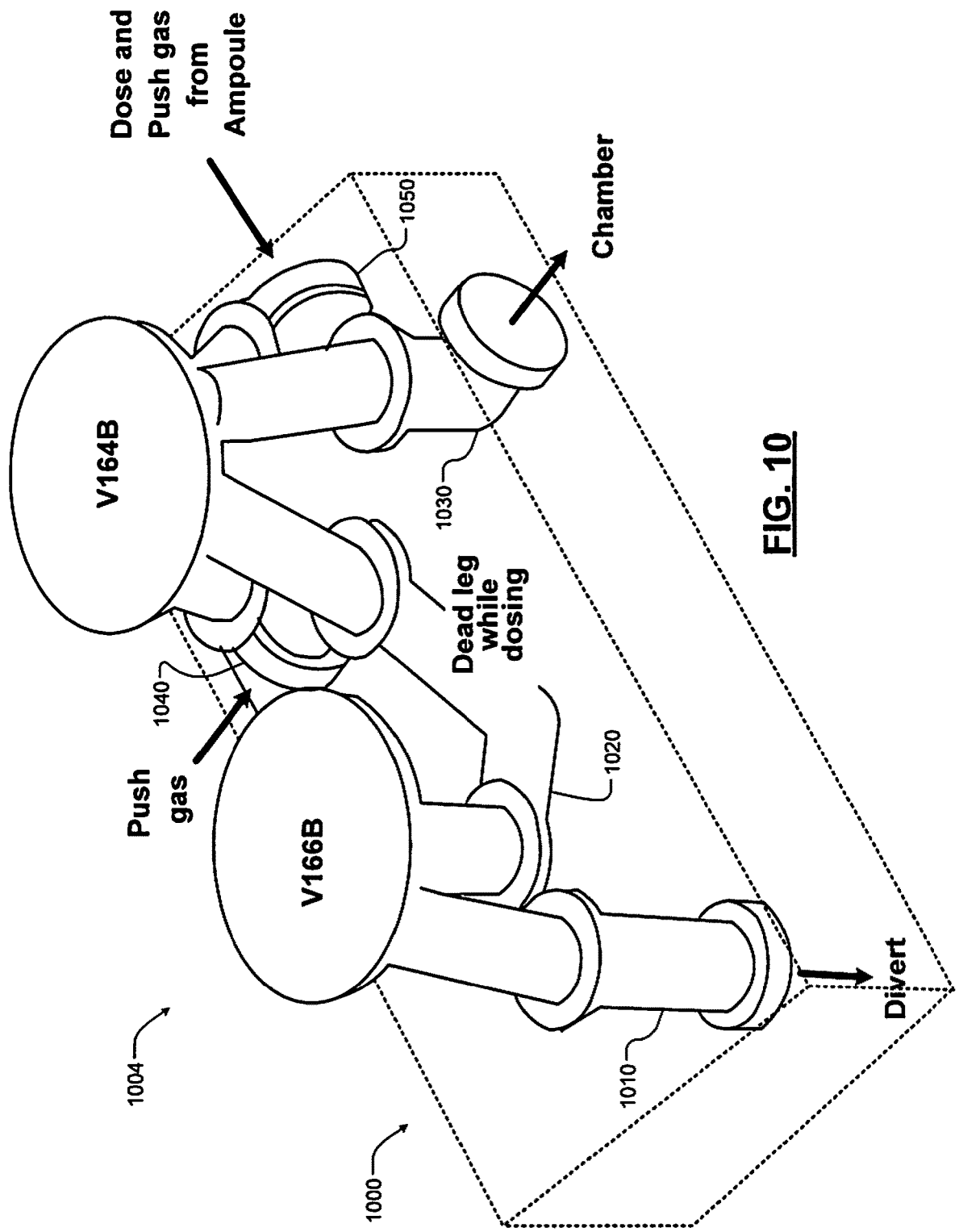
FIG. 10 is a perspective view illustrating an example of a valve manifold and valve inlets of the second valve assembly of FIG. 7.

Referring now to FIG. 10, a portion of the second valve assembly is shown to include a valve manifold block 1000 and valve inlets 1004 to the 2-port and 4-port valves 702 and 704, respectively. The valve manifold block 1000 defines a first channel 1010 that connects to the second port of the 2-port valve 702. The valve manifold block 1000 defines a second channel 1020 connecting the first port of the 2-port valve 702 to a first port of the 4-port valve 704. The valve manifold block 1000 defines a third channel 1050 (receiving dose and carrier gas) connected to the first port of the 4-port valve 704. The valve manifold block 1000 defines a fourth channel 1040 connected to the third port of the 4-port valve 704 (receiving push gas). The valve manifold block 1000 defines a fifth channel 1030 connected to the fourth port of the 4-port valve 704 (directing gases to the processing chamber).

In some examples, the second valve assembly 700 defines a very small volume between the first node 710 and the inlet of the first valve V166B. In some examples, the volume is less than 4 ml. In some examples, the volume is less than 3 ml. In other examples, the volume is 2.3 ml. Unlike the first valve assembly 300, the dose flow of the second valve assembly 700 to the processing chamber travels through one valve (the second valve V164B). The flow to the processing chamber expands out of center port into a plenum. During the diverting step, the dead leg is cleared. During the dosing step, the gas is trapped in the dead leg.

Figure 11:
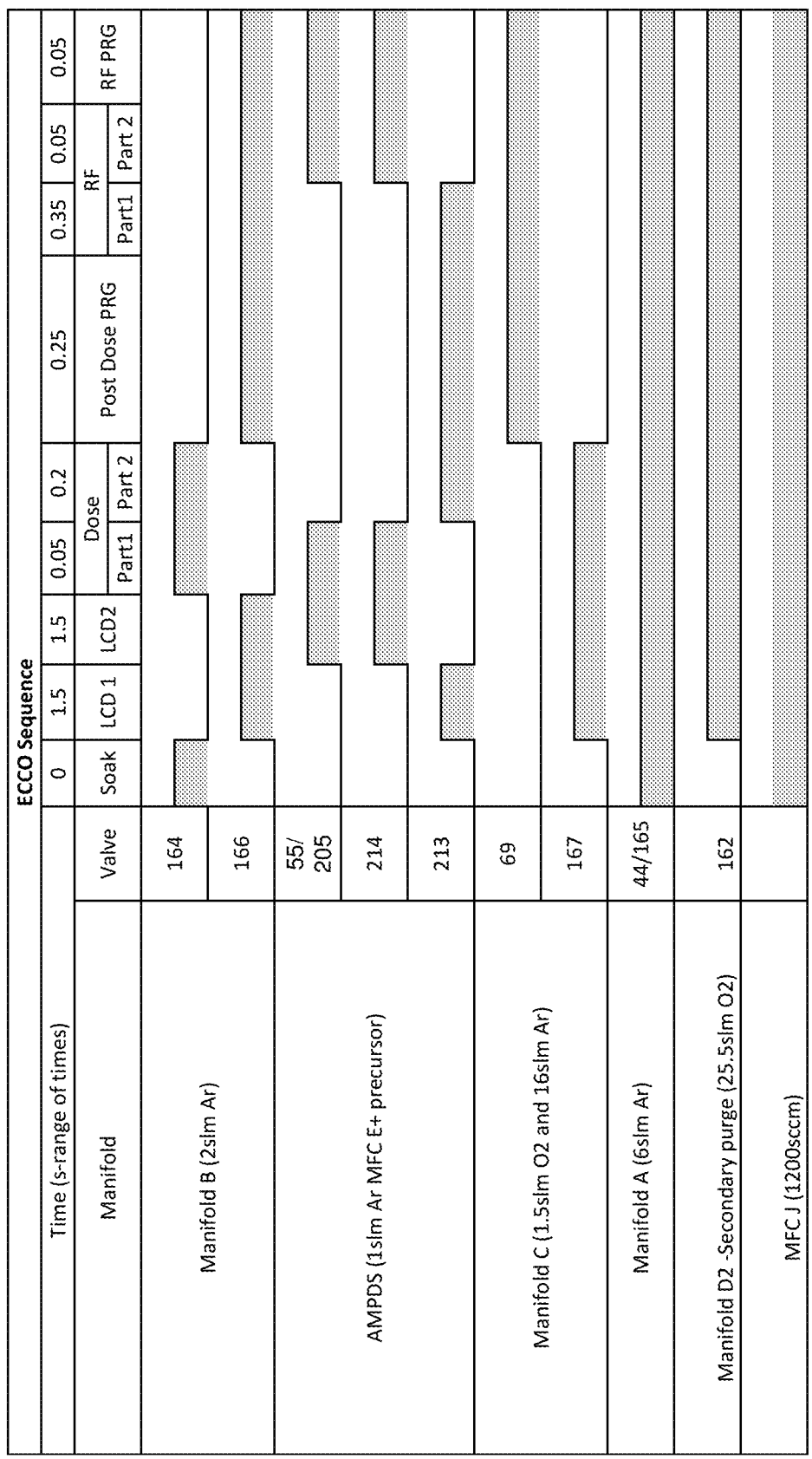
FIG. 11 is a timing diagram for operating valves in the first and second valve assemblies of FIGS. 3 and 7.

Referring now to FIG. 11, a timing diagram is shown for operating valves using the first and second valve assemblies 300 and 700, respectively. While specific values for switching periods are shown, other periods can be used. During a soak period, a first gas mixture from a manifold is supplied to the processing chamber using the second valve V164. During a diverting period including LCD1 and LCD2, the second valve V164 is closed and the first valve V166 is open. During LCD1, the valve V213 is open to supply push gas. During LCD2, the valve V213 is closed and the valves V205, V214 and V55 are opened to supply vaporized precursor. In some examples, the period of LCD1 is 1.5 s and the period of LCD2 is 1.5 s.

During Part1 of a dose period, the valves V205, V214 and V55 remain open. During Part1 and Part2 of the dosing period, the valve V166 is closed and V164 is open. The duration of Part1 will depend on gas transport times and in some examples the period is 0.05 s. In some examples, the duration of Part2 is 0.2 s. After dosing, the valve V166 is opened and the valve V164 is closed.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the processing chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas delivery system for a substrate processing system, comprising:
  a 2-port valve including:
    a first port and a second port; and
    a first valve located between the first port and the second port;
  a 4-port valve including:
    a first port, a second port, a third port and a fourth port;
    a first node connected to the first port and the second port;
    a bypass path located between the third port and the fourth port;
    a second node located along the bypass path between the third port and the fourth port; and a second valve located between the first node and the second node;
a manifold block defining gas flow channels:
configured to connect the first port of the 4-port valve to a first inlet;
configured to connect the second port of the 4-port valve to the first port of the 2-port valve;
configured to connect the third port of the 4-port valve to a second inlet;
configured to connect the second port of the 2-port valve to a first outlet; and
configured to connect the fourth port of the 4-port valve to a second outlet;
a first gas source;
a second gas source;
a manifold connected to the first inlet;
a third valve selectively connecting the first gas source to the manifold; and
a fourth valve selectively connecting the second gas source to the manifold.

2. The gas delivery system of claim 1, wherein the first gas source supplies a push gas, the second gas source supplies a dose gas, and the second outlet is connected to a processing chamber.

3. The gas delivery system of claim 2, wherein the second gas source includes an ampoule supplying vaporized precursor.

4. The gas delivery system of claim 1, further comprising:
a controller configured to set states of the first valve, the second valve, the third valve and the fourth valve in a diverting mode, wherein the first valve is open, the second valve is closed, the third valve is open and the fourth valve is closed during the diverting mode; and
wherein a first gas from the first gas source is diverted from the second outlet to the first outlet.

5. The gas delivery system of claim 4, wherein the controller is further configured to set the states of the first valve, the second valve, the third valve and the fourth valve in a dosing mode after the diverting mode, wherein the first valve is closed, the second valve is open, the third valve is open and the fourth valve is open during the dosing mode, and wherein the first gas from the first gas source and a second gas from the second gas source are delivered to the second outlet connected to a processing chamber during a dosing operation.

6. The gas delivery system of claim 5, wherein a dead leg is created between the first node and an inlet of the first valve during the dosing mode.

7. The gas delivery system of claim 6, wherein the dead leg defines a volume less than 2.5 ml.

8. The gas delivery system of claim 4, wherein there is no dead leg volume during the diverting mode.

9. A substrate processing system comprising:
a processing chamber including a gas distribution device connected to the first outlet of the gas delivery system of claim 1;
a substrate support;
an RF generator; and
a controller configured to strike plasma between the gas distribution device and the substrate support during a dosing mode.

10. The gas del very system of claim 1, wherein the second port of the 4-port valve connects at the first node at an angle between 60 and 120 degrees relative to the first port of the 4-port valve.

* * * * *